United States Patent
Naffziger (12)

(10) Patent No.: US 6,466,057 B1
(45) Date of Patent: Oct. 15, 2002

(54) FEEDBACK-INDUCED PSEUDO-NMOS STATIC (FIPNS) LOGIC GATE AND METHOD

(75) Inventor: Samuel D Naffziger, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/489,086

(22) Filed: Jan. 21, 2000

(51) Int. Cl.[7] .............................................. H03K 19/094
(52) U.S. Cl. ........................... 326/121; 326/93; 326/95; 326/98
(58) Field of Search ............................. 326/93, 95, 97, 326/98, 121

(56) References Cited

U.S. PATENT DOCUMENTS

| | | | | |
|---|---|---|---|---|
| 4,710,650 A | * | 12/1987 | Shoji ............................ | 326/98 |
| 5,117,133 A | * | 5/1992 | Luebs .......................... | 326/55 |
| 5,541,537 A | * | 7/1996 | Kim et al. .................... | 326/121 |
| 5,640,105 A | * | 6/1997 | Sobelman et al. ........... | 326/36 |
| 5,748,012 A | * | 5/1998 | Beakes et al. ................ | 326/93 |
| 5,831,451 A | * | 11/1998 | Bosshart ....................... | 326/93 |
| 5,896,399 A | * | 4/1999 | Lattimore et al. ........... | 714/721 |
| 5,910,735 A | * | 6/1999 | Allen ............................ | 326/93 |
| 5,926,487 A | * | 7/1999 | Chappell et al. ........ | 371/22.31 |
| 5,942,917 A | * | 8/1999 | Chappell et al. ............. | 326/121 |
| 6,081,130 A | * | 6/2000 | Cao et al. ..................... | 326/55 |
| 6,208,907 B1 | * | 3/2001 | Durham et al. .............. | 700/121 |

OTHER PUBLICATIONS

Rhyne, "Fundamentals of Digital Systems Design", N.J., 1973, pp 70–71).*

* cited by examiner

Primary Examiner—Michael G. Lee
Assistant Examiner—Steven S. Paik

(57) ABSTRACT

A new family of pseudo-NMOS static logic gates is provided that use feedback from a shared output node to enhance the response of and applicability of such static logic gates. In architecture, the feedback-induced pseudo-NMOS static (FIPNS) logic gate comprises (a) a pulldown network having one or more pulldown NMOS transistors for receiving one or more inputs, (b) a primary pullup network having one or more primary pullup PMOS transistors connected to the NMOS transistor network at a shared output node, which produces a gate output, and (c) a secondary pullup network having one or more secondary pullup PMOS transistors connected to the NMOS transistor network by way of an actuation mechanism, which causes actuation of the secondary pullup PMOS transistor(s) based upon feedback from the shared output node to thereby increase pullup drive strength relative to pulldown drive strength.

18 Claims, 7 Drawing Sheets

FEEDBACK-INDUCED PSEUDO-NMOS STATIC (FIPNS) LOGIC GATE AND METHOD

FIELD OF THE INVENTION

The present invention generally relates to digital logic circuits, for example but not limited to, integrated circuits (ICs), and more particularly, to a new family of pseudo-NMOS static logic gates that use feedback from a shared node that produces the output in order to enhance the response speed of and applicability of such gates.

BACKGROUND OF THE INVENTION

Static logic gates based upon CMOS (complementary metal oxide semiconductor) technology are generally slow because an input must drive both NMOS (n-channel MOS) arid PMOS (p-channel MOS) field effect transistors (FETs). In any transition, either a pullup PMOS transistor network or a pulldown NMOS transistor network is activated, which means that the input capacitance of the inactive network loads the input. Moreover, PMOS transistors have poor mobility and must be wider than NMOS transistors to achieve comparable rising and falling delays, further increasing input capacitance. Pseudo-NMOS static logic gates and dynamic logic gates, which require a precharge, offer improved speed by removing the PMOS transistor load from the input.

Pseudo-NMOS gates resemble CMOS gates, but replace the slow PMOS pullup transistor(s) with a grounded PMOS transistor(s) that acts as a pullup resistor. The effective pullup resistance should be large enough that the NMOS transistor(s) can pull the output to near ground, yet low enough to pull the output to high voltage quickly. Margin must be provided for manufacturing variations in the relative PMOS and NMOS mobilities. In addition, a pseudo-NMOS gate is smaller than a CMOS gate, making it even more desirable than a CMOS gate in some implementations.

Although meritorious to an extent, pseudo-NMOS static logic gates have disadvantages and limited applicability. Typically, they are used by logic circuit designers only selectively for high fan-in logic functions. The reason is that the output of a pseudo-NMOS static logic gate must be capable of, after performing a logic evaluation upon its inputs, exhibiting high voltage (for a logic high) or transitioning from high voltage to low voltage (for a logic low). In order to accomplish this functionality while observing the aforementioned resistance limitations, the pullup network typically requires a PMOS transistor(s) having a large width in order to pull up quickly, but this large PMOS transistor(s) then impedes the pull down speed, which is driven by the NMOS transistor(s). The result is a difficult and efficient compromise, because as is well known in the art, in order to achieve a PMOS transistor with the same drive strength as an NMOS transistor, the PMOS transistor must be at least twice the width of the corresponding NMOS transistor. Consequently, a static logic gate should have a fan-in of ten or more NMOS transistors before a pseudo-NMOS gate is better in terms of speed than a static CMOS transistor implementation.

SUMMARY OF THE INVENTION

The present invention provides a new family of pseudo-NMOS static logic gates that use feedback from a shared node to enhance the response of and applicability of such static logic gates. In fact, because of the enhanced performance of the feedback-induced pseudo-NMOS static (FIPNS) logic gates in accordance with the present invention, the FIPNS logic gates are more desirable than CMOS transistor implementations when the fan-in of NMOS transistors is much lower that prescribed by conventional wisdom.

In architecture, broadly stated, the FIPNS logic gate comprises at least (a) a pulldown network having one or more pulldown NMOS transistors for receiving one or more inputs, (b) a primary pullup network having one or more primary pullup PMOS transistors connected to the NMOS transistor network at a shared node, which produces a gate output, and (c) a secondary pullup network having one or more secondary pullup PMOS transistors connected to said NMOS transistor network by way of a suitable actuation mechanism, which causes actuation of the secondary pullup PMOS transistor(s) based upon feedback from the shared node to thereby increase pullup drive strength relative to pulldown drive strength. In the preferred embodiment (a nonlimiting example), the actuation mechanism is merely a delay mechanism comprising one or more cascaded logic gates. The FIPNS logic gate can be configured and used to perform any type of logic function upon one or more inputs. the present invention can also be conceptualized as providing one or more new methods. As an example of one such method, the present invention can be viewed as providing a method for enhancing the applicability and speed of a pseudo-NMOS logic gates, comprising at least the steps of: (a) providing a static logic gate comprising a pulldown network having at least one or more pulldown NMOS transistors for receiving one or more inputs and a pullup network having at least one or more pullup PMOS transistors connected to the NMOS transistor network at a shared node for producing an output; and (b) dynamically increasing pullup drive strength relative to the pulldown drive strength based upon feedback from the shared node.

Other features, advantages, systems, and methods that are provided by the present invention will become apparent to one with skill in the art upon examination of the following drawings and detailed description. It is intended that all such additional features, advantages, systems, and methods be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENTS

Figure 1:
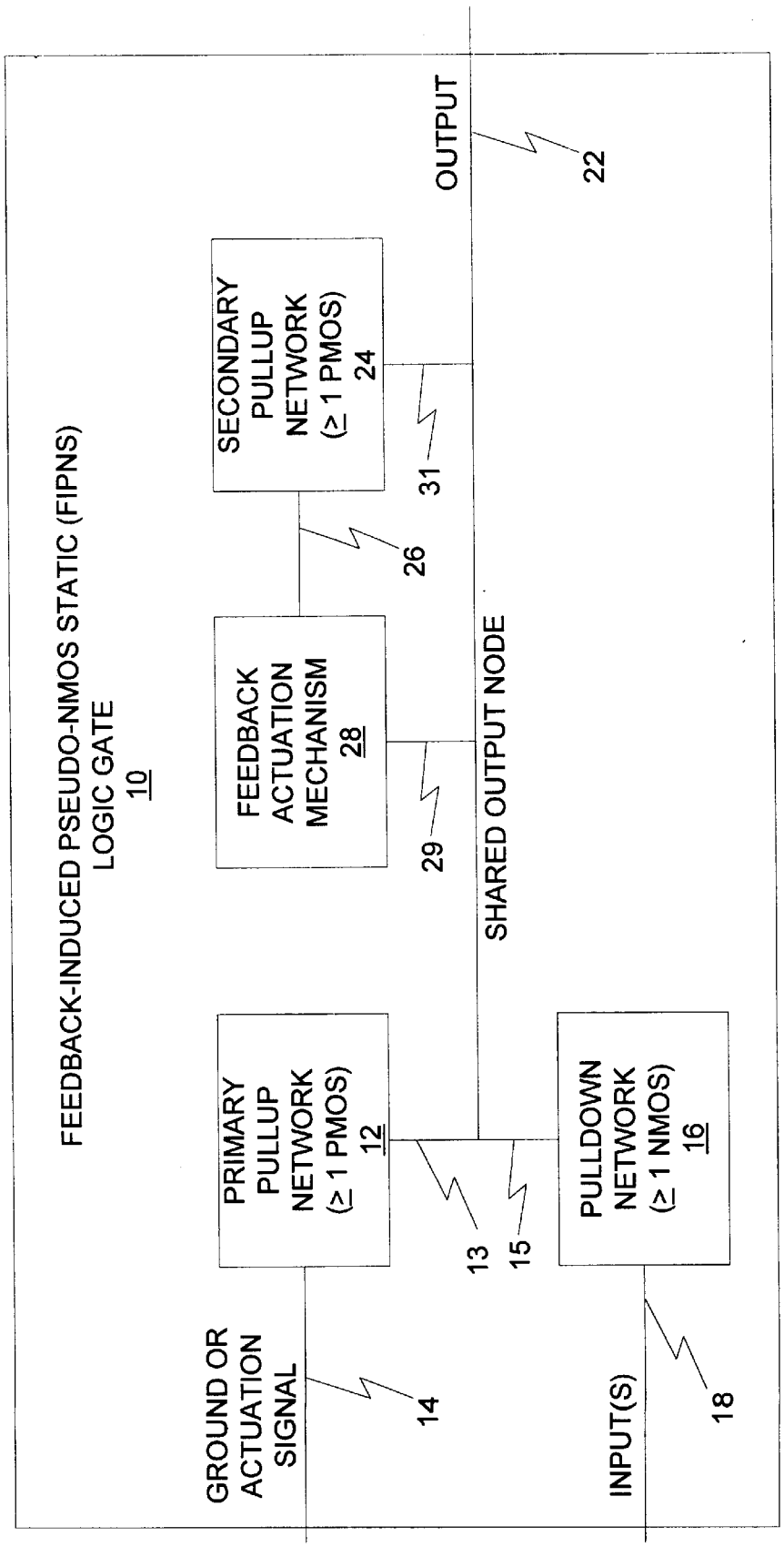
FIG. 1 is a block diagram showing a feedback-induced pseudo-NMOS static (FIPNS) logic gate in accordance with the present invention.

FIG. 1 is a electronic block diagram showing the high level concept of a feedback-induced pseudo-NMOS static (FIPNS) logic gate in accordance with the present invention, which is generally denoted by reference numeral 10.

The logic gate 10 of FIG. 1 constitutes the fundamental building block for a new pseudo-NMOS-based logic family. The FIPNS logic gate 10 can be configured, cascaded, and/or used to implement any desired logic function upon one or more inputs, for example but not limited to, any of the following well known logic functions: AND, OR, INVERTOR, BUFFER, NAND, NOR, and XOR (exclusive OR), XNOR (exclusive NOR, or equivalence), etc. The FIPNS logic gate 10 is capable of being cascaded or connected to an inverter, for example, a CMOS inverter or latch, if desired. The logic gate 10 can also be used in combination with other static logic gates, for example, CMOS logic gates, as well as dynamic logic gates, for example, domino or mousetrap logic gates, without occurrences of undesirable logic hazards, or glitches.

In architecture, just as with a traditional pseudo-NMOS static logic gate, the FIPNS logic gate 10 of the present invention includes a pullup network 12, having at least one or more PMOS field effect transistors (PMOSFETs; not shown in FIG. 1 for simplicity) that have their gates either grounded or asserted/deasserted via an actuation signal 14 (for example, a clock signal CK), and a pulldown network 16, having at least one or more NMOS field effect transistors (NMOSFETs; not shown in FIG. 1 for simplicity) with their gates connected to and actuated by one or more respective inputs 18 that are evaluated by the gate 10. In some designs, it is possible that the pulldown network 16 may include one or more PMOS transistors (for example, for logic inversions), but the network 16 is predominantly typically made up of NMOS transistors. The pullup network 12 is connected to the network 16 by way of a shared output node 22 that produces the gate output. Generally, a traditional pseudo-NMOS static logic gate, as well as the FIPNS logic gate 10 of the present invention, have their logic functionality defined by the specific configuration of NMOS logic gates in the pulldown network 16. In the art, the pulldown network 16 is said to reside in the "critical path," where logic evaluations are performed upon the one or more inputs 18.

In accordance with a significant aspect of the present invention, the FIPNS logic gate 10 includes a secondary pullup network 24, in addition to the primary pullup network 12. The secondary pullup network 24 comprises at least one or more PMOS transistors, that are selectively actuated by a feedback actuation mechanism 28 based upon feedback from the output node 22 in order to adjust the ratio of pullup drive strength to pulldown drive strength associated with the gate 10. The feedback can be any suitable detectable parameter, for example but not limited to, voltage, current, logic state, a combination of any of the foregoing, etc. The combination of the secondary pullup network 24 and the feedback actuation mechanism 28 enables the FIPNS logic gate 10 to recover more quickly after performing a logic evaluation. As a result, the FIPNS logic gate 10 is more desirable than a traditional pseudo-NMOS static logic gate and is better than a static CMOS implementation when there is an NMOS transistor fan-in of five or more transistors. Fan-in is basically the maximum number of signals that can be fed to a gate at one time without risking signal corruption.

Each FIPNS logic gate 10 uses feedback to condition its response to better prepare for producing the next edge at its output 22. The new FIPNS logic gates 10 retain the flexibility and fan-in insensitivity of conventional pseudo-NMOS static logic gates, but improves on pseudo-NMOS static logic gates by (1) speeding up a falling edge on the shared output node 22 by disabling the strong secondary pullup network 24 when the shared output node 22 is at a high voltage; and (2) speeding up a rising edge on the shared output node 22 by enabling both the strong and weak pullup networks 24, 12, respectively, when the shared output node 22 is at a low voltage. This feature overcomes the tradeoff between pullup and pulldown speed in conventional pseudo-NMOS static logic circuits, resulting in a power delay improvement by a factor of at least approximately 12.

Figure 2:
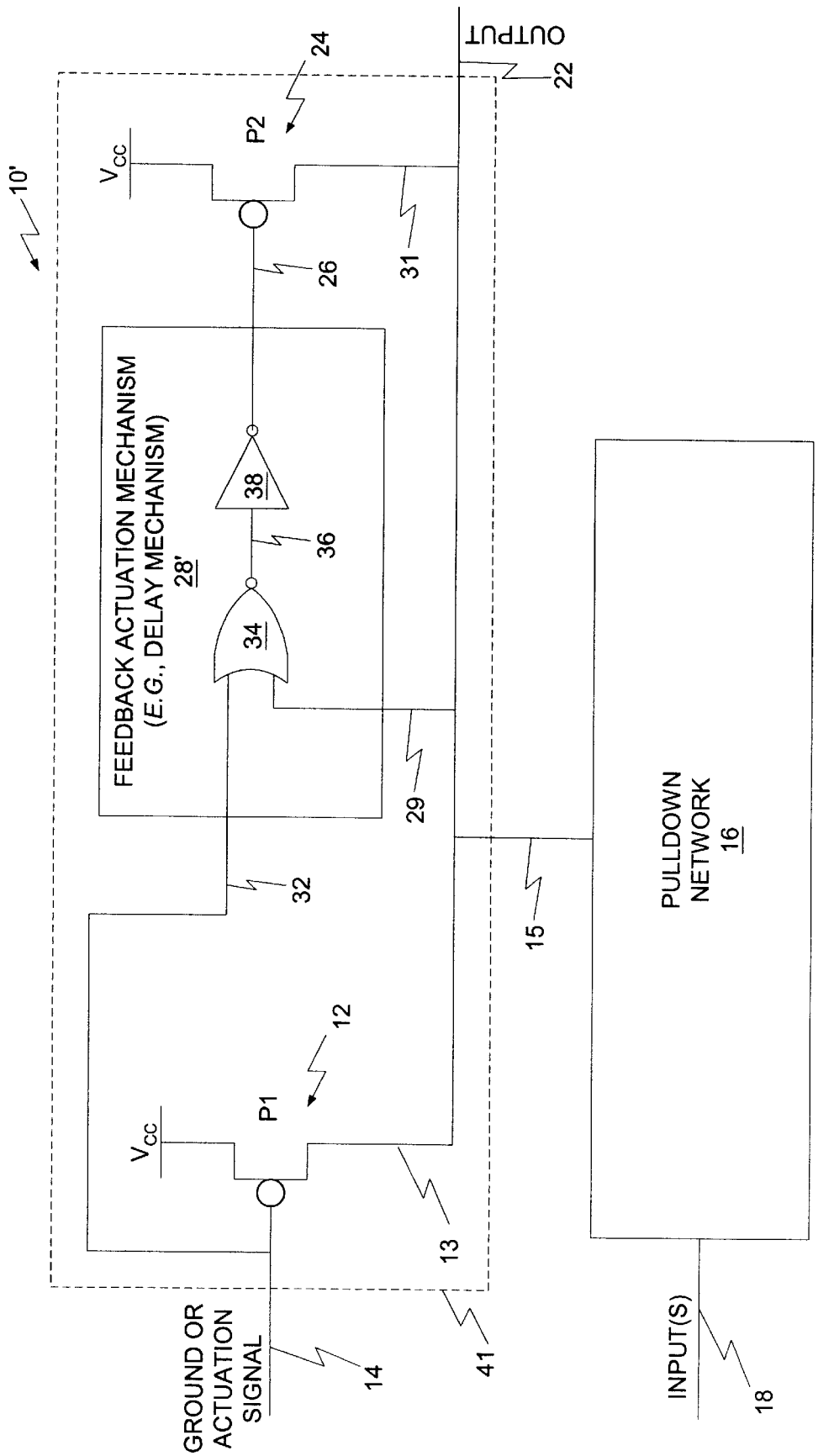
FIG. 2 is a schematic diagram showing an example implementation of the feedback-induced pseudo-NMOS static logic gate of FIG. 1.

FIG. 2 shows a preferred embodiment of the FIPNS logic gate 10 (FIG. 1), which is generally denoted by reference numeral 10. As shown in FIG. 2, the primary and secondary pullup networks 12, 24 are implemented via PMOS transistors P1, P2, respectively. In the preferred embodiments, the ratio of the primary and secondary pullup PMOS transistors, P1, P2, collectively, to the pulldown NMOS transistor(s) associated with pulldown network 16 is approximately 1/1, and further, the ratio of the secondary pullup PMOS transistor P2 to the primary pullup PMOS transistor P1 is approximately 4/1. Given the greater mobility of the NMOS transistors, the 1/1 ratio results in a low output voltage at the shared node of ~1/5 of the supply. Almost needless to say, there is some flexibility with respect to the foregoing ratios. However, if the P2/P1 ratio is set too large, then the shared output node 22 that produces gate output will not transition to the high voltage $V_{CC}$, and noise problems will result from static current. Further, if the P2/P1 ratio is set too small, then there will be no speed benefit gained from the FIPNS logic gate 10 as compared to a traditional pseudo-NMOS static logic gate. The P2/P1 ratio as well as ratio of total pullup PMOS transistors to pulldown NMOS transistors may also be affected by the number and configuration of NMOS transistors associated with the pulldown network 16. If there are a large number of pulldown NMOS transistors, then the ratio may be increased (not necessarily linearly), and if there is a lesser number of pulldown NMOS transistors, then the ratio may be reduced (not necessarily linearly).

Moreover, in the preferred embodiments, the feedback actuation mechanism 28 is implemented, for example but not limited to, in the form of a delay mechanism. Examples of delay mechanisms include a long interconnect, a capacitance and/or inductance network, a series of cascaded logic gates, etc. In the preferred embodiments, the delay mechanism is implemented via two successive stages of combinational logic particularly, a NOR logic gate 34 in series with an inverter 38, of any suitable logic family. The NOR logic gate 34 enables use of an actuation signal 14, such as a clock signal CK, as opposed to ground. Effectively, the actuation signal 14 periodically emulates ground during logic evaluations by the FIPNS logic gate 10, and it, at other times, exhibits another electrical state, so that power consumption can be conserved.

Figure 3:
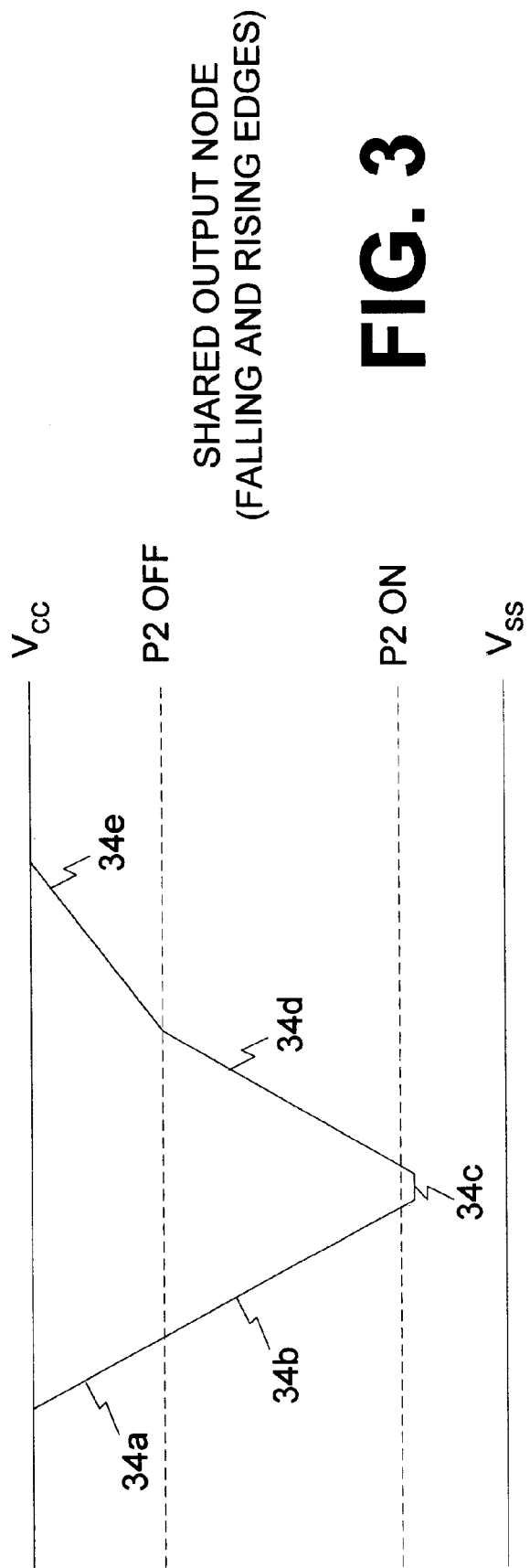
FIG. 3 is a graph (voltage verses time) showing the response of a falling edge associated with the share node (produces the output) of the feedback-induced pseudo-NMOS static logic gate of FIG. 1.

FIG. 3 illustrates the voltage versus time response of the shared output node 22 that produces the gate output of the novel FIPNS logic gate 10. Referring to FIG. 3, in the preferred embodiments, the delay mechanism 28' is designed to cause falling and rising edges associated with the shared output node 22 to respond as shown. The high voltage $V_{CC}$ (indicative of a logic high, or in binary logic nomenclature, a "1") is typically anywhere between about +3 and about +18 volts, while voltage $V_{SS}$ is typically around 0 (indicative of a logic low, or in binary logic nomenclature, a "0").

Initially, the shared output node 22 (and gate output) exhibits a voltage that is at or in close proximity to the high voltage $V_{CC}$, as a result of it being pulled high by the PMOS transistor P1 (FIG. 2). After a logic evaluation is performed by the pulldown network 16, the shared output node 22 will remain at high voltage $V_{CC}$ to indicate a logic high at gate output 22, or alternatively, the shared output node 22 will ultimately be driven to low voltage to exhibit a logic low at the gate output 22.

In the latter situation, the shared output node 22 (and gate output) starts to transition to lower voltage from $V_{CC}$, as indicated by reference numerals 34a and 34b. In the preferred embodiment, at this point, the PMOS transistor P1 is turned on (i.e., gate is voltage biased, causing conduction between the source and drain of P1), while the PMOS transistor P2 is still turned off (i.e., gate is not sufficiently voltage biased to permit conduction between the source and drain of P2). Once the falling edge associated with the shared output node 22 reaches the low output voltage $V_{OL}$ (indicative of a logic low) or some other suitable threshold, as indicated by reference numeral 34c, then the delay mechanism 28' (FIG. 2) turns on the PMOS transistor P2 via connection 26 (FIG. 2) to the gate associated with PMOS transistor P2.

At this point, as illustrated in FIG. 3, the output node 22 begins to transition to high voltage. Both the PMOS transistors P1, P2 pull the output node 22 high (more quickly than a traditional pseudo-NMOS static logic gate), as indicated by rising edge identified by reference numeral 34d. Eventually, PMOS transistor P2 is turned off as the voltage associated with the output node 22 approaches the high voltage $V_{CC}$. After the PMOS transistor P2 is turned off, the PMOS transistor P1 alone pulls the voltage associated with the output node 22 up closer to $V_{CC}$, as indicated by reference numeral 34e (which is at a rate that is slower than when both P1, P2 were actuated; compare the slopes associated with reference numerals 34d and 34e). Finally, the voltage associated with the output node 22 reaches a steady state voltage, which is at or in close proximity to the high voltage $V_{CC}$. At this point, the FIPNS logic gate 10 is ready for performing another logic evaluation.

The feedback actuation mechanism 28 may be designed to ensure that the output voltage on output node 22 is sufficiently high to be detected as a logic high ("1") before P2 turns off. When the actuation delay is defined to this effect, the FIPNS logic gate 10' can perform another logic operation at any point during this transition, even before the gate has completed the previous transition.

Figure 4A:
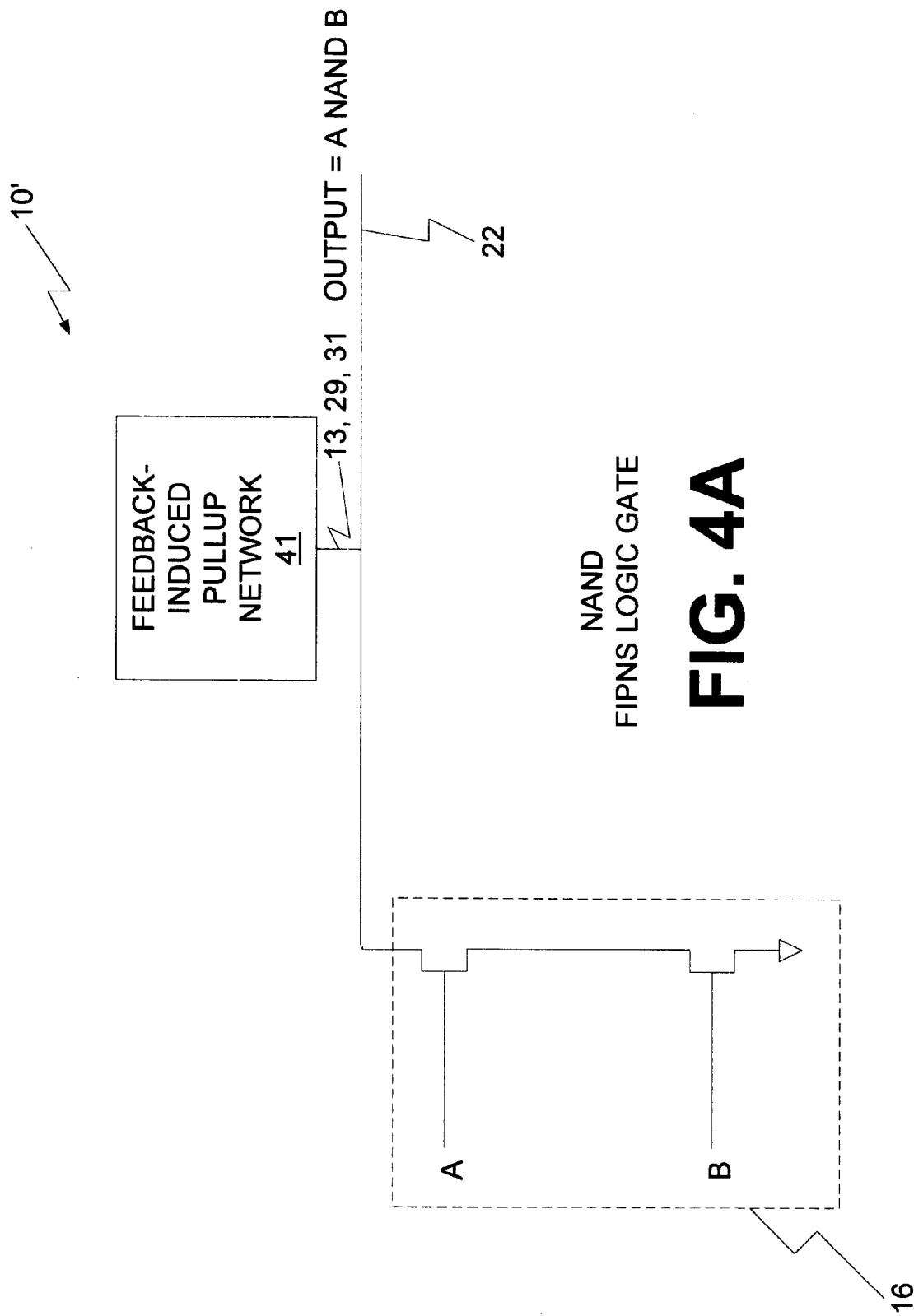
FIG. 4A is a schematic diagram of a NAND FIPNS logic gate.

FIG. 4A shows an example implementation of the FIPNS logic gate 10' that performs a NAND logic operation upon inputs A and B. The feedback-induced pullup network 41 includes the pullup PMOS transistors P1, P2 and the feedback actuation mechanism 28'. The output 22 is defined by the following boolean equation:

OUTPUT=A NAND B

Figure 4B:
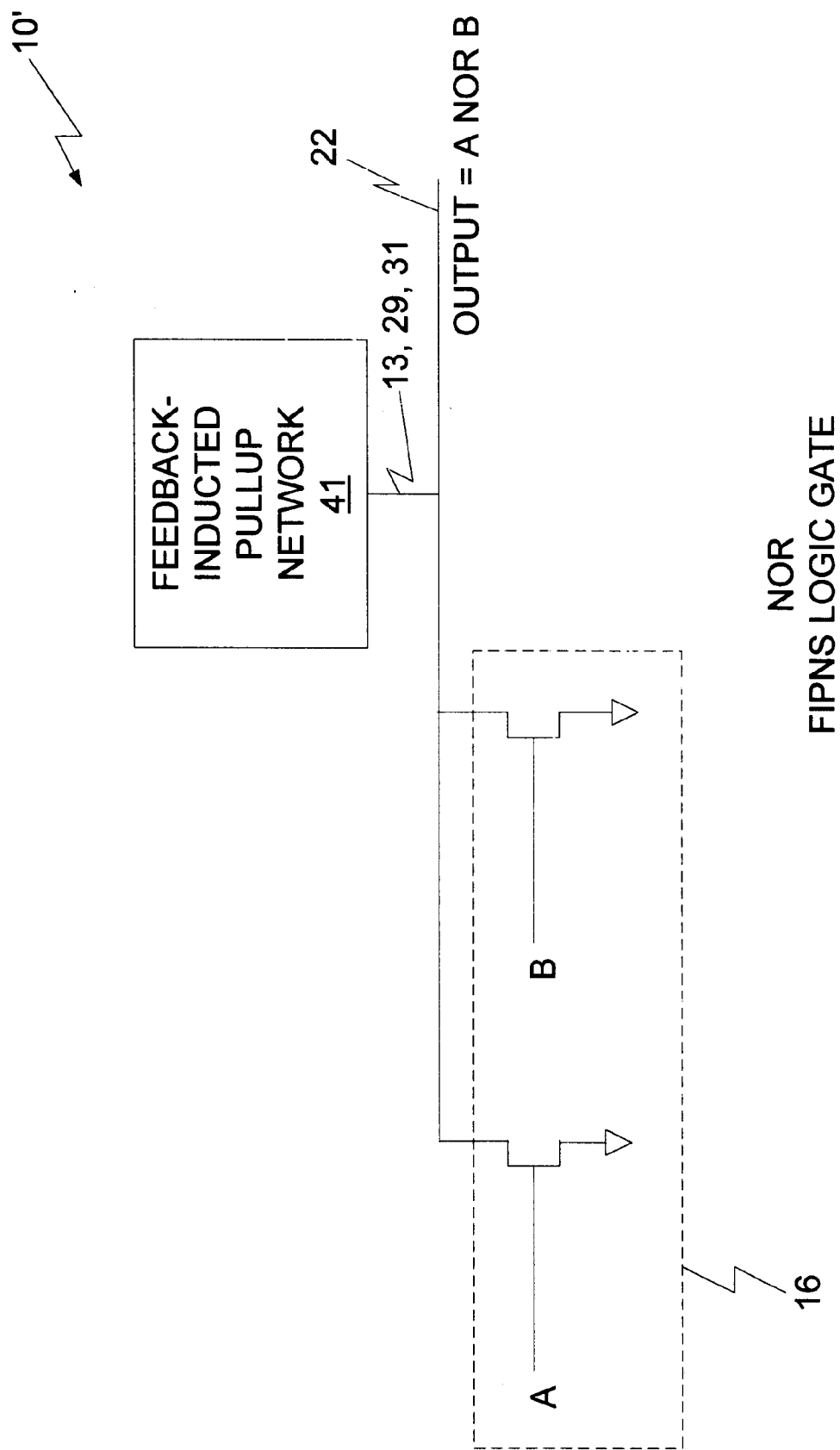
FIG. 4B is a schematic diagram of a NOR FIPNS logic gate.

FIG. 4B is an example implementation of an FIPNS logic gate 10' for performing a NOR logic operation upon inputs A and B. The output 22 is defined by the following boolean equation:

OUTPUT=A NOR B

Figure 4C:
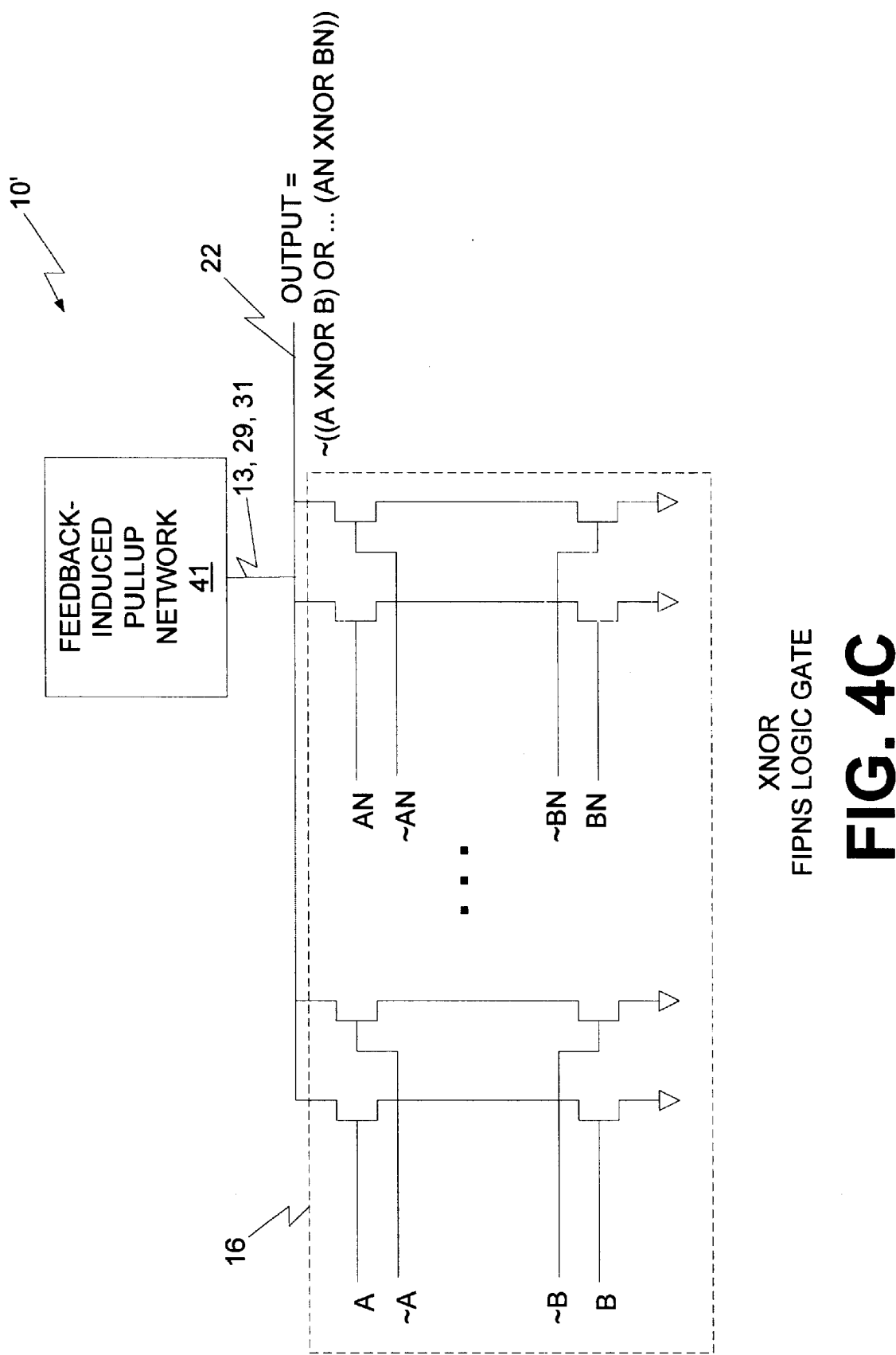
FIG. 4C is a schematic diagram of an XNOR FIPNS logic gate.

FIG. 4C is an example implementation of an FIPNS logic gate 10' for performing a XNOR logic operation upon inputs AI and BI, where I=1, . . . , N. The output 22 is defined by the following boolean equation:

OUTPUT=~((A XNOR B) OR . . . (AN XNOR BN))

Figure 4D:
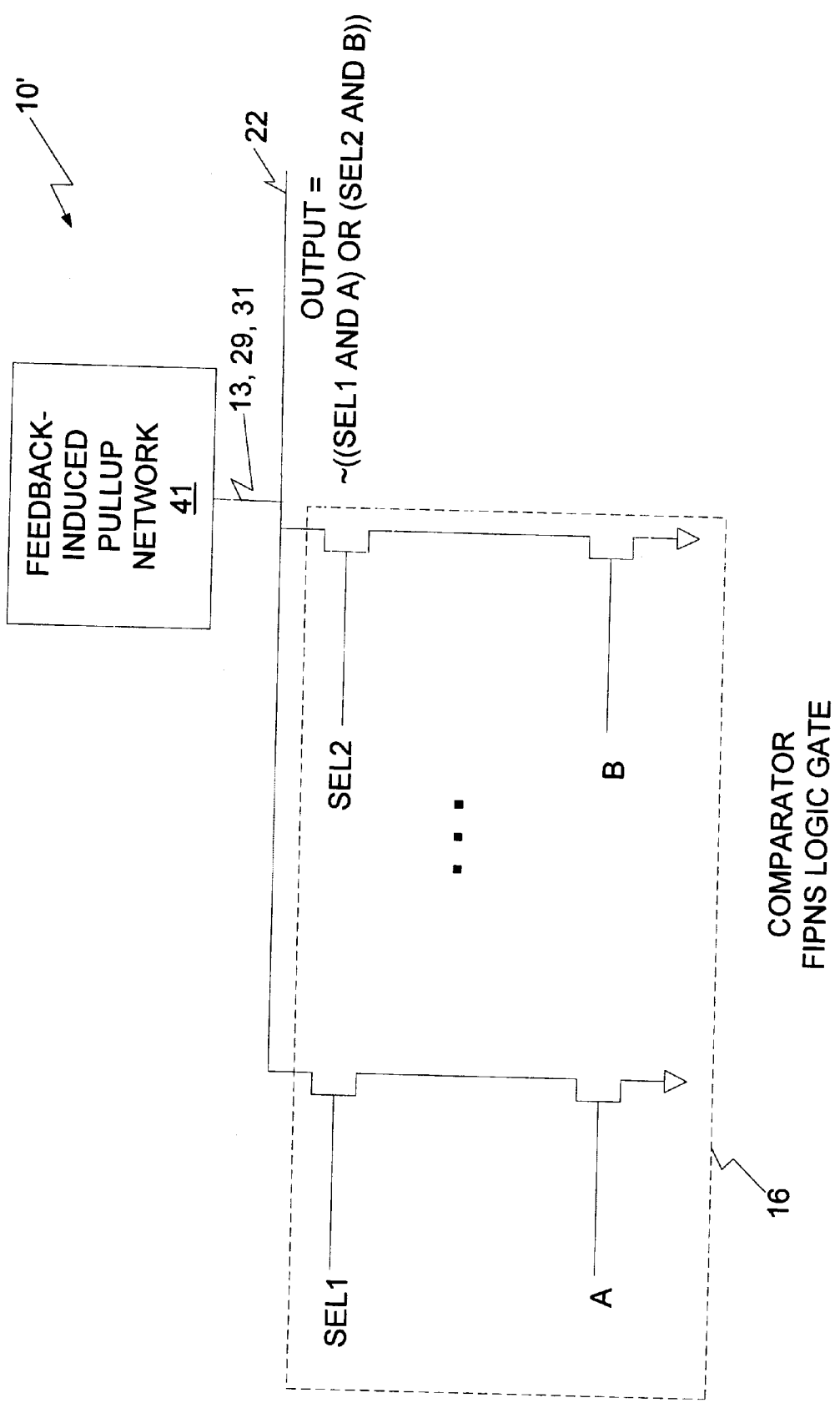
FIG. 4D is a schematic diagram of a comparator FIPNS logic gate.

FIG. 4D is an example implementation of an FIPNS logic gate 10' for performing a comparator logic operation upon input A through N based upon select signals SEL1 through SELN, respectively. The output 22 is defined by the following boolean equation:

OUTPUT=~((SEL1 AND A) OR . . . (SELN AND N))

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A static logic gate, comprising:
    a pulldown network having one or more pulldown NMOS transistors for receiving one or more inputs for the static logic gate;
    a primary pullup network operating in contention with said pulldown network having one or more primary pullup PMOS transistors connected to said pulldown network at a shared output node in said static logic gate, said shared output node producing the gate output; and
    a secondary pullup network having one or more secondary pullup PMOS transistors connected to said pulldown network by way of an actuation mechanism in said static logic gate, said actuation mechanism causing actuation of said one or more secondary pullup PMOS transistors based upon feedback from said shared output node.

2. The gate of claim 1, wherein said actuation mechanism is a delay mechanism comprising one or more logic gates.

3. The gate of claim 1, wherein a first ratio of said primary and secondary pullup PMOS transistors to said pulldown NMOS transistor is approximately 1/1 and a second ratio of said secondary pullup PMOS transistors to said primary pullup PMOS transistors is approximately 4/1.

4. The gate of claim 1, wherein said primary pullup PMOS transistors are actuated periodically by a periodically asserted signal.

5. The gate of claim 1, wherein said pulldown network is configured so that a NOR logic operation is performed upon at least two of said inputs.

6. The gate of claim 1, wherein said pulldown network is configured so that a NAND logic operation is performed upon at least two of said inputs.

7. The gate of claim 1, wherein said pulldown network is configured so that an XNOR logic operation is performed upon at least two of said inputs.

8. The gate of claim 1, wherein said pulldown network is configured so that a comparator logic operation is performed in connection with at least two of said inputs.

9. A static logic gate comprising:
    a pulldown transistor means for receiving, an input to the static logic gate;
    a pullup transistor means connected to said pulldown transistor means at a shared output node in the static logic gate for operating in contention with said pulldown transistor means, said shared output node providing the gate output; and
    means for adjusting drive strength of said pullup transistor means to said pulldown transistor means based upon feedback from said shared output node in the static logic gate.

10. The gate of claim 9, wherein said means for adjusting comprises:

a secondary pullup transistor means; and delay means for selectively connecting and disconnecting said secondary pullup transistor means to said shared output node, when appropriate, based upon feedback from said shared output node.

11. An improvement for a pseudo-NMOS transistor static logic gate comprising an NMOS transistor network as part of the static logic gate having one or more pulldown NMOS transistors for receiving one or more inputs and a pullup PMOS transistor network operating in contention with said pulldown NMOS transistors having one or more pullup PMOS transistors connected to said NMOS transistor network at a shared output node in the static logic gate, said shared output node producing an output, the improvement comprising a means for adjusting drive strength associated with said pullup PMOS transistor network relative to said pulldown NMOS transistor network based upon feedback from said shared output node in the static logic gate.

12. A method for a pseudo-NMOS logic gate, comprising the steps of:

providing a static logic gate comprising a pulldown network having at least one or more pulldown NMOS transistors for receiving at least one or more inputs and a pullup network operating in contention with said pulldown network having at least one or more pullup PMOS transistors connected to said pulldown network at a shared output node producing an output; and dynamically increasing pullup drive strength based upon feedback from said shared output node.

13. The method of claim 12, further comprising the step of specifically defining said pulldown network to perform a specific boolean logical operation upon said inputs to produce said output.

14. The method of claim 12, wherein the dynamically adjusting step is performed by the following steps:

receiving feedback from said shared output node;

delaying said feedback; and actuating one or more secondary PMOS transistors with said delayed feedback which enhances said drive strength.

15. A method for a static logic gate to operate, comprising the steps of:

receiving one or more inputs at a pulldown network in the static logic gate;

driving a shared output node coupled to the pulldown network to a low state from a steady state as a result of a logic evaluation executed by the pulldown network;

activating a primary pullup network in contention with the pulldown network and a secondary pullup network to transition the shared output node from the low state back to the steady state; and adjusting the rate of transition from low state to steady state by actuating a delay mechanism, wherein the delay mechanism toggles the secondary pullup network based upon feedback received from the shared output node.

16. The method of claim 15, wherein the delay mechanism toggles the secondary pullup network when the state of shared output node is sufficiently high to be detected as a logic high.

17. The method of claim 15, wherein both the primary and secondary pullup networks are comprised of field effect transistors, and further wherein the secondary network as a greater number of field effect transistors than the primary pullup network.

18. The method of claim 17, wherein the ratio of transistors in the secondary pullup network to the primary pullup network is a value sufficient to recognize a speed benefit in transitioning the shared output node from a low state to a steady state while avoiding noise resulting from static current.

* * * * *